United States Patent [19]

Ishiyama et al.

[11] 4,034,318
[45] July 5, 1977

[54] ELASTIC SURFACE WAVE FILTER

[75] Inventors: Hideki Ishiyama; Atushi Inoue; Hideharu Ieki, all of Nagaokakyo, Japan

[73] Assignee: Murata Manufacturing Co., Ltd., Nagaokakyo, Japan

[22] Filed: Mar. 12, 1976

[21] Appl. No.: 666,304

[30] Foreign Application Priority Data

Mar. 12, 1975 Japan .................. 50-34112[U]
Mar. 19, 1975 Japan .................. 50-37826[U]

[52] U.S. Cl. .................. 333/72; 310/8.9; 333/30 R
[51] Int. Cl.² .................. H03H 9/10; H03H 9/26; H03H 9/06
[58] Field of Search .................. 333/30 R, 71, 72; 310/8, 8.1, 8.2, 8.9, 9.1, 9.4, 9.8; 317/101 R, 101 A, 101 B; 29/25, 35; 174/50.62, 50.52, 50.54

[56] References Cited

UNITED STATES PATENTS

| | | | |
|---|---|---|---|
| 3,694,674 | 9/1972 | Inoue | 310/8.2 |
| 3,872,331 | 3/1975 | Falco | 310/9.4 |
| 3,885,173 | 5/1975 | Lee | 310/9.4 |

*Primary Examiner*—Alfred E. Smith
*Assistant Examiner*—Marvin Nussbaum
*Attorney, Agent, or Firm*—Birch, Stewart, Kolasch & Birch

[57] ABSTRACT

An elastic surface wave filter having a substrate of piezoelectric material and input and output transducer electrodes of interleaved-comb-type rigidly mounted on one surface of the substrate. The substrate is steadily supported in position within a casing by means of elastic support means which are made of synthetic or natural rubber material and which support means not only act as supporting instruments for the substrate, but also as vibration absorbing instruments for substantially suppressing unnecessary wave propagation through the substrate.

4 Claims, 11 Drawing Figures

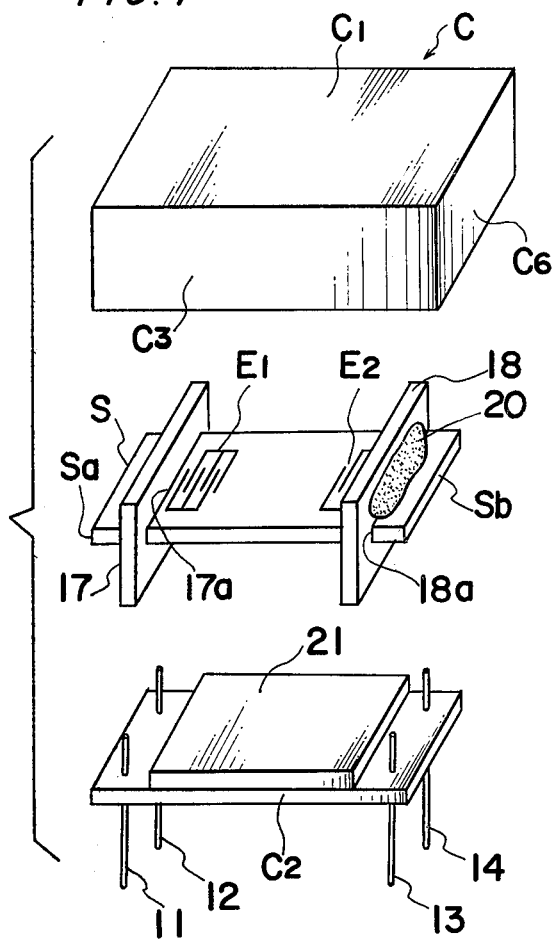
FIG. 1
FIG. 2
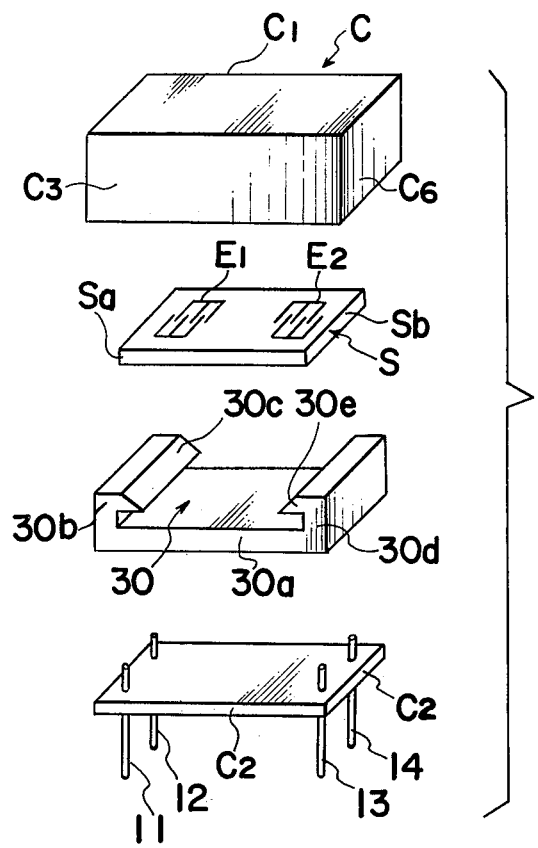
FIG. 3

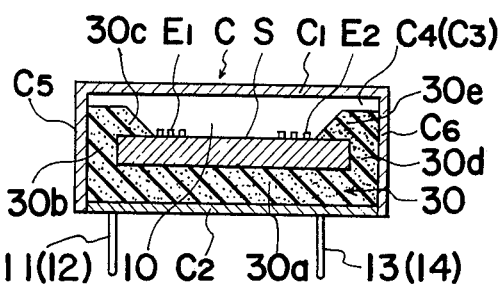
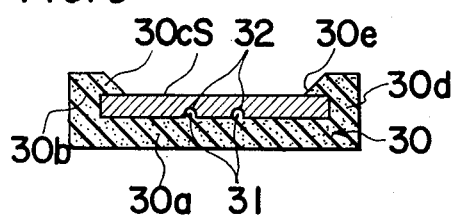
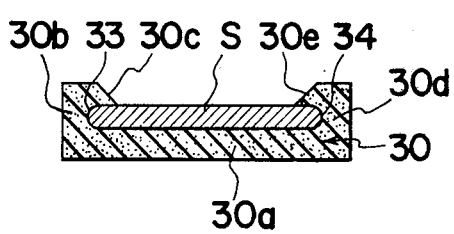
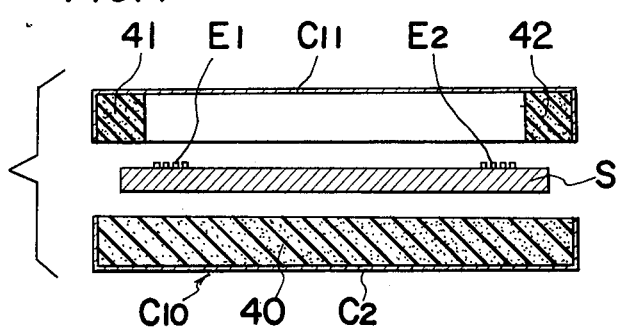
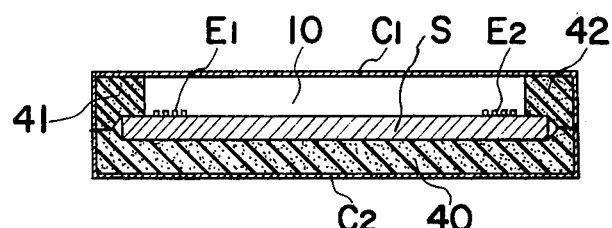
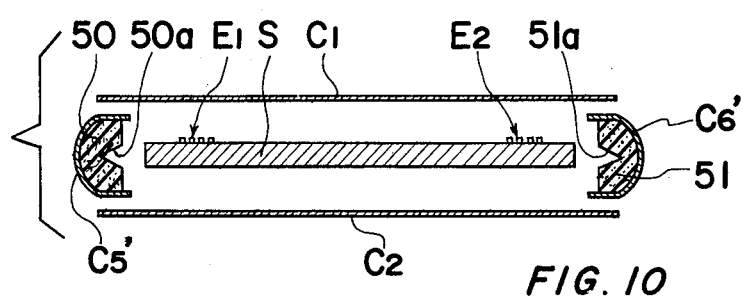
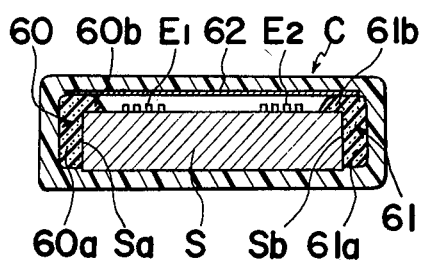
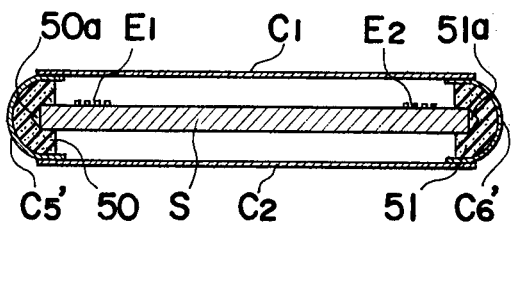

ELASTIC SURFACE WAVE FILTER

The present invention relates to an elastic surface wave filter and, more particularly, to an elastic surface wave filter of a type comprising a substrate of piezoelectric material accommodated within a casing and having one surface formed with a pair of interleaved-comb-type transducing systems.

The elastic surface wave filter of the type referred to above is known. Functionally, when an electric signal from a suitable signal source is applied to one of the transducing systems, a periodic electric field is produced and the input signal is converted into an acoustic surface wave propagating elastically through the piezoelectric substrate by the effect of piezoelectric coupling, which acoustic surface wave is sensed and again converted by the other of the transducing systems into an electric output signal to be applied to an external load circuit.

In order to render the surface wave filter to give a desired or designed operating characteristic, it is well recognized that the mode of propagation of elastic surface waves through the piezoelectric substrate is one of the most important factor to consider. This is because the surface wave travelling through the piezoelectric substrate is not always unidirectional and, therefore, some propagates from the input transducing system towards the output transducing system and some propagates from the input transducing system in a direction opposite to the output transducing system. The surface wave which has propagated from the input transducing system in the direction opposite to the output transducing system is in turn reflected by one or more surfaces of the piezoelectric substrate, the reflected surface wave ultimately interferring with the surface wave which is propagating from the input transducing system towards the output transducing system. Such interference is in fact undesirable and should, therefore, be avoided.

In order to substantially eliminate or suppress the reflected surface wave interferring with the surface wave propagating from the input transducing system towards the output transducing system, the prior art is that elastic adhesive material is applied on the piezoelectric substrate and in position to substantially absorb that portion of the propagating surface waves which travels from the input transducing system in a direction opposite to the output transducing system and/or which travels towards a substantially central area of the substrate after having been reflected by one or more surfaces of said piezoelectric substrate.

The employment of the elastic adhesive material is, so long as it has an elasticity, satisfactory is substantially attenuating the reflected surface wave. However, aging of the elastic adhesive material results in reduction in elasticity,, that is, hardening or curing of the material applied and, therefore, the filter tends to fail to exhibit a constant operating characteristic throughout the duration thereof.

Moreover, the conventional surface wave filter is such that the piezoelectric substrate is supported by and within the casing. Therefore, the piezoelectric substrate is liable to damage, or otherwise undesirable displacement, once it has received an external impact.

Accordingly, the present invention has for its essential object to provide an improved interleaved-comb-type surface wave filter wherein a piezoelectric substrate is supported in position within a casing by means of at least two elastic support elements made of rubber material thereby substantially eliminating the disadvantages and inconveniences inherent in prior art filters of a similar kind.

Another important object of the present invention is to provide an improved surface wave filter of the type referred to above, wherein the elastic support elements serve not only as reflected surface wave absorbing instruments, but also as dampers for preventing the piezoelectric substrate from receiving external impacts which may be applied thereto during, for example, transportation of the surface wave filter from place to place.

A further object of the present invention is to provide an improved surface wave filter of the type referred to above, wherein the substrate can readily be mounted into the casing with no substantial skill required in assembling the filter.

According to the present invention, these objects of the present invention can readily be accomplished by the employment of first and second elastic support means made of synthetic or natural rubber material, for example, silicone rubber. These first and second elastic support means are positioned on the piezoelectric substrate so that reflected portion of the reflected surface wave can substantially be suppressed.

In addition, since the first and second elastic support means have elasticity, they serve not only as instrument for supporting the piezoelectric substrate in position within the casing, but also as cushioning instruments for absorbing an external impact being imposed on the filter device.

BRIEF DESCRIPTION OF THE DRAWING

These and other objects and features of the present invention will become apparent from the following description taken in conjunction with preferred embodiments thereof with reference to the accompanying drawings, in which:

FIG. 1 is an exploded view of an elastic surface wave filter according to one preferred embodiment of the present invention;

FIG. 2 is a longitudinal sectional view, on a somewhat enlarged scale, of the surface wave filter shown in FIG. 1;

FIG. 3 is an exploded view of an elastic surface wave filter according to another preferred embodiment of the present invention;

FIG. 4 is a longitudinal sectional view of the surface wave filter shown in FIG. 3;

FIGS. 5 and 6 are views similar to FIG. 4, with a casing removed away, illustrating respective modifications thereof;

FIG. 7 is an exploded view of an elastic surface wave filter according to a further embodiment of the present invention;

FIG. 8 is a longitudinal sectional view of the surface wave filter shown in FIG. 7;

FIG. 9 is an exploded view of an elastic surface wave filter according to a still further embodiment of the present invention;

FIG. 10 is a longitudinal sectional view of the surface wave filter shown in FIG. 9; and FIG. 11 is a longitudinal sectional view of an elastic surface wave filter according to a still filter embodiment of the present invention.

Before the description of the present invention proceeds, it is to be noted that like parts are designated by like reference numerals throughout the accompanying drawings.

Referring first to FIGS. 1 and 2, a filter casing, generally indicated by C and made of electrically insulating material, has a top and bottom all portions C1 and C2, a pair of opposed side walls C3 and C4 and a pair of opposed walls C5 and C6, all assembled to define an interior chamber 10. In the instance as shown, however, upper edges of the individual side and end walls C3, C4, C5 and C6 are rigidly connected to, or otherwise integrally formed with, four-cornered peripheral edges of the top wall C1 to substantially provide a container-like covering while the bottom wall C2 is adapted to be inserted substantially halfway into the container-like covering and held in position to close the lower opening of the container-like covering as best shown in FIG. 2.

A substrate S of substantially rectangular plate-like configuration made of any known piezoelectric material has a pair of spaced, interleaved-comb-type input and output transducer electrodes E1 and E2 formed on one surface thereof in any known manner. Each of the input and output transducer electrodes E1 and E2 has a pair of comb-type electrode arrays, conductive elements of one comb-type electrode array being interleaved with the conductive elements of the other comb-type electrode array. The input transducer electrode E1 is adapted to be coupled to a source of electric signal while the output transducer electrode E2 is adapted to be coupled to a load circuit. For this purpose, the bottom wall C2 is provided with terminal pins 11, 12, 13 and 14 non-movably extending through respective corner portions thereof, to which terminal pins 11 to 14 of the electrode arrays of the input and output transducer electrodes E1 and E2 are connected by means of associated lead wires, two of which are illustrated by 15 and 16 in FIG. 2.

The substrate S is supported in position within the interior chamber 10 in substantially parallel relation to any one of the top and bottom walls C1 and C2 at intervals to the side walls C5 and C6. For this purpose, a pair of spaced electric support blocks 17 and 18 are employed, which blocks 17 and 18 are made of synthetic or natural rubber material, preferably silicone rubber. These elastic support blocks 17 and 18 have respective slots 17a and 18a formed therein, each of said slots 17a and 18a being of a size substantially equal to the cross sectional area of the substrate S taken along the widthwise direction thereof. The substrate S is supported by these elastic support blocks 17 and 18 with the opposed end portions thereof extending through the slots 17a and 18a, respectively.

As hereinbefore described, the elastic surface wave driven by the input transducer electrode E1 by the application of an electric signal thereto from the signal source (not shown) tends in part to travel in a direction towards the output transducer electrode E2 and in part to travel towards an end face Sa of the substrate in a direction opposed to the output transducer electrode E2. That portion of the elastic surface wave which travels towards the end face Sa of the substrate S is, after haing impinged upon said end face Sa, reflected back towards the input transducer electrode E1, tending to interfere with that portion of the elastic surface wave propagating from the input transducer electrode E1 towards the output transducer electrode E2. Similar phenomenon occurs with respct to the elastic surface wave travelling past the output transducer electrode E2 and impinging upon the opposed end face Sb.

Since each surface wave interference is undesirable and should be eliminated, the elastic support blocks 17 and 18 are so positioned on the substrate S between the end face Sa and the input transducer electrode E1 and between the end face Sb and the output transducer electrode E2, respectively, as to substantially suppress that portion of the surface wave travelling towards, and subsequently reflected from, any of the end faces Sa and Sb of the substrate.

For avoiding any possible displacement of the support blocks 17 and 18 relative to the substrate S, synthetic resinous adhesive material is applied at 19 and 20 where that portions of the elastic surface wave reflected from the end face Sa and Sb, respectively, exist.

An elastic or cushioning seat 21 is rigidly mounted on the bottom wall C2, filling up a space defined between the substrate S and the bottom wall C2 and between the support blocks 17 and 18. Installation of this cushioning seat 21 can readily be achieved prior to mounting of the assembly of the substrate S with the blocks 17 and 18 on the bottom wall C2. The cushioning seat 21 is also made of synthetic or natural rubber material, preferably substantially the same material as employed for the elastic support blocks 17 and 18. The cushioning seat 21 may not always be necessary. However, the employment of the cushioning seat 21 is recommended in view of the fact that together with the elastic support blocks 17 and 18 the cushioning seat 21 provides a higher resistance to external impacts, which the substrate S may receive during, for example, transportation of the filter device from place to place, than that afforded solely by the elastic support blocks 17 and 18.

After the filter device has been assembled as shown in FIG. 2, a substantial layer of synthetic resin 22 is applied over an exterior surface of the bottom wall C2 to substantially hermetically seal the interior chamber 10. It is to be noted that, prior to the application of the synthetic resinous layer 22, an inert gaseous medium may be filled into the interior chamber 10 of the casing C.

In the foregoing embodiment of FIGS. 1 and 2, the substrate S has been described as supported in position within the interior chamber 10 by means of separate and independent support members such as designated by 17, 18 and 21. However, in the embodiment which will subsequently be described with reference to FIGS. 3 and 4, these support members are integrally formed into a single support structure 30.

With reference to FIGS. 3 and 4, the support structure 30 is made of synthetic or natural rubber material, preferably silicone rubber, and has a base portion 30a, a pair of upright portions 30b and 30d integrally extending from the opposed ends of said base portion 30a at right angles to the plane of said base portion 30a, and a pair of overhang portions 30c and 30e integrally extending from the respective upright portions 30b and 30d in a direction opposite to each other. The spacing between any one of the overhang portions 30c and 30e and the base portion 30a, that is, the height of each of the upright portions 30b and 30d, is so selected that the corresponding end of the substrate S can elastically be held and clamped between the overhang portion 30c or 30e and the base portion 30a with the surface of said substrate held flat against the base portion 30a as best shown in FIG. 4.

The assembly so far described is installed within the interior chamber 10 of the casing C with the base portion 30a rigidly mounted on the bottom wall C2.

The base portion 30a may, as shown in FIG. 5, have one or more ribs 31 projecting upwardly from one of the opposed surfaces thereof which is held in contact with the substrate S while grooves 32 mating in shape to the ribs 31 are formed in the substrate S.

Moreover, the opposed ends of the substrate S may be outwardly rounded as shown in FIG. 6, in which case the upright portions 30b and 30d must have recesses 33 and 34 so complementary in shape to the rounded ends of the substrate S as to accommodate said rounded ends of said substrate S therein.

In the embodiment shown in FIGS. 7 and 8, elastic support means for supporting the substrate S in position within the interior chamber 10 of the casing C comprises a cushioning seat 40 of a length greater than the length of the substrate S, which cushioning seat 40 is made of synthetic or natural rubber material, preferably silicone rubber, and a pair of opposed elastic support blocks 41 and 42 made of synthetic or natural rubber material, preferably silicone rubber. As best shown in FIG. 8, the substrate S is supported in position within the interior chamber 10 in such a manner that, while the substrate S is held flat against the cushioning seat 40, the opposed end portions of said substrate S are essentially sandwiched between the cushioning seat 40 and the elastic support blocks 41 and 42.

The casing C employed in the embodiment of FIGS. 7 and 8 may be of the same construction as that employed in any of the foregoing embodiments of FIG. 1 and 2 and FIGS. 3 and 4. However, in order to facilitate assemblage of the filter device, as best shown in FIG. 7, the casing C is composed of a container C10 of a size sufficient to accommodate the cushioning seat 40 therein and a top covering C11 similar in shape and size to the container C10. While the cushioning seat 40 is accommodated in the container C10, the support blocks 41 and 42 are rigidly secured to th top covering C11 in position immediately above the opposed ends of the substrate S lying on the cushioning seat 40.

In the embodiment shown in FIGS. 9 and 10, the support means for the substrate S comprises a pair of opposed elastic support members 50 and 51 made of synthetic or natural rubber material, preferably silicone rubber. Each of the elastic support members 50 and 51 is formed with a substantially V-shaped groove 50a or 51a for receiving the corresponding end portion of the substrate S, as will readily be understood from the subsequent description, and is, by the use of a bonding agent, rigidly secured to the corresponding end wall of the casing C.

As best shown in FIGS. 9 and 10, the end walls are outwardly concaved to provide respective spaces for accommodation of the associated elastic support members 50 and 51 with the grooves 50a and 50b facing each other.

In the manufacture of the filter device according to the embodiment of FIGS. 9 and 10, after the elastic support members 50 and 51 have been secured to the outwardly concaved end walls C5' and C6', respectively, the support members 50 and 51 are attached to the substrate S with the opposed ends of said substrate substantially wedged into the associated grooves 50a and 51a in the respective support members 50 and 51 and, thereafter, the top and bottom walls C1 and C2 are secured to the end walls C5' and C6'.

In the embodiment of FIGS. 9 and 10, a functional and structural equivalent of the cushioning seat 21 which has been described as employed in the embodiment of FIGS. 1 and 2 may be mounted on the bottom wall C2 and immediately below the substrate S, if desired.

The casing C may be made of thermosetting synthetic resin. In the embodiment of FIG. 11, such thermosetting synthetic resin is utilized as material for the casing C. Prior to the synthetic resin being thermoset to complete the casing C, elastic support members 60 and 61, each having an upright portion 60a and 61a and an overhang portion 60b or 61b, are fitted to the opposed ends of the substrate S in such a manner that the upright portions thereof contact the associated end faces Sa and Sb of the substrate S while the overhang portions 60b and 61b overhang upper edge portions, adjacent the end faces Sa and Sb, of the substrate S. The assembly is, after a top lid 62 of electrically insulating material has been mounted above the electrode-mounted surface of the substrate S so as to bridge between the overhang portions 60b and 61b, enveloped by a thermosetting synthetic resin which is subsequently thermally set to complete the casing C.

From the foregoing description, it has now become clear that the substrate of piezoelectric material, for example, one of ceramic materials containing barium titanate, is sufficiently and effectively protected from external impacts which may otherwise lead to possible displacement or damage within the interior chamber of the casing and, on the other hand, that unnecessary reflected surface waves are sufficiently and effectively suppressed.

Although the present invention has fully been described in connection with the preferred embodiments thereof with reference to the accompanying drawings, it is to be noted various changes and modifications are apparent to those skilled in the art. Therefore, such changes and modifications are, unless they depart from the true scope of the present invention as defined in the appended claims, to be understood as included therein.

What is claimed is:

1. An elastic surface wave filter device which comprises:
   a casing of substantially cubic body having top and bottom wall portions opposed to each other, a pair of opposed side wall portions and a pair of opposed end wall portions, all connected together to provide an interior chamber therein;
   a substrate of piezoelectric material housed within said interior chamber and extending in substantially parallel relation to any of said top and bottom wall portions, said substrate including interleaved comb-type input and output transducing systems rigidly mounted on one of the opposed surfaces of said substrate which faces said top wall portion, said input and output transducing systems being respectively located adjacent the opposed ends of said substrate in spaced, but piezoelectrically coupled, relation to each other;
   first and second elastic support means, made of rubber material, for steadily supportion said substrate within said interior chamber, said first and second elastic support means serving as substantial cushioning elements for absorbing an external impact being imposed on said filter device and for concurrently suppressing that portion of elastic surface waves which, during energization of said transducing systems and after having been propagated along the substrate from the input transducing system towards the output transducing system, may be reflected back towards such an area as substantially defined between said input and output transducing systems, said first and second electric support means being so positioned between the input transducing system and one of the opposed end wall portions adjacent said input transducing system and between the output transducing system and the other of said opposed end wall portions adjacent said output transducing system, respectively, facing the direction of propagation of the reflected surface waves towards said area on said substrate; and a third elastic support means secured in position between the other of the opposed surfaces of said substrate and said bottom wall portion;

wherein each of said first and second elastic support means comprises a support member of substantially inverted L-shape having an upright portion and an overhang integral with said upright portion, and said third elastic support means is constituted by a support member of substantially plate-like configuration having opposed ends integral with said upright portions, said substrate being supported in such a manner that, while said other of said opposed surfaces of said substrate is held flat against said support member, the opposed end portions of said substrate are substantially clamped into betweeen said overhang portions and said opposed ends of said support member, respectively.

2. A filter device as claimed in claim 1, wherein the other of said opposed surfaces of said substrate is formed with a plurality of parallel grooves and wherein said support member is formed with projections equal in number to said grooves and engaged in said grooves.

3. An elastic surface wave filter device which comprises:

a casing of substantially cubic body having top and bottom wall portions opposed to each other, a pair of opposed side wall portions and a pair of opposed end wall portions, all connected together to provide an interior chamber therein;

a substrate of piezoelectric material housed within said interior chamber and extending in substantially parallel relation to any of said top and bottom wall portions, said substrate including interleaved comb-type input and output transducing systems rigidly mounted on one of the opposed surfaces of said substrate which faces said top wall portion, said input and output transducing systems being respectively located adjacent the opposed ends of said substrate in spaced, but piezoelectrically coupled, relation to each other; and first and second elastic support means, made of rubber material, for steadily supporting said substrate within said interior chamber, said first and second elastic support means serving as substantial cushioning elements for absorbing an external impact being imposed on said filter device and for concurrently suppressing that portion of elastic surface waves which, during energization of said transducing systems and after having been propagated along the substrate from the input transducing system towards the output transducing system, may be reflected back towards such an area as substantially defined betweeen said input and output transducing systems, said first and second elastic support means being so positioned between the input transducing system and one of the opposed end wall portions adjacent said input transducing system and between the output transducing system and the other of said opposed end wall portions adjacent said output transducing system, respectively, facing the direction of propagation of the reflected surface waves towards said area on said substrate;

wherein said end wall portions of said casing are outwardly curved in opposite manner to each other, said first and second elastic support means being secured to and accommodated in substantially concaved spaces defined by said outwardly curved end wall portions, respectively; and wherein said first and second elastic support means are formed with substantially V-shaped grooves, respectively, said substrate being held in position within said interior chamber with its opposed ends substantially wedged into said V-shaped grooves in said first and second elastic support means.

4. An elastic surface wave filter device which comprises:

a casing of substantially cubic body having top and bottom wall portions opposed to each other, a pair of opposed side wall portions and a pair of opposed end wall portions, all connected together to provide an interior chamber therein;

a substrate of piezoelectric material housed within said interior chamber and extending in substantially parallel relation to any of said top and bottom wall portions, said substrate including interleaved comb-type input and output transducing systems rigidly mounted on one of the opposed surfaces of said substrate which faces said top wall portion, said input and output transducing systems being respectively located adjacent the opposed ends of said substrate in spaced, but piezoelectrically coupled, relation to each other;

first and second elastic support means, made of rubber material, for steadily supporting said substrate within said interior chamber, said first and second elastic support means serving as substantial cushioning elements for absorbing an external impact being imposed on said filter device and for concurrently suppressing that portion of elastic surface waves which, during energization of said transducing systems and after having been propagated along the substrate from the input transducing system towards the output transducing system, may be reflected back towards such an area as substantially defined between said input and output transducing systems, said first and second elastic support means being so positioned between the input transducing system and one of the opposed end wall portions adjacent said input transducing and between the output transducing system and the other of said opposed end wall portions adjacent said output transducing system, respectively, facing the direction of propagation of the reflected surface waves towards said area on said substrate;

each of said first and second elastic support means comprising a support means of substantially inverted L-shape having an upright portion and an overhang portion integral with said upright portion, said upright portion filling a space defined between any one of the opposed ends of said substrate and the adjacent end wall portion of the casing, said overhang portion protruding towards the transducing system to overhang a corresponding corner portion of the substrate; and a top covering mounted on said overhang portions of said first and second elastic support means in spaced relation to said other of said opposed surfaces of said substrate and above said transducing systems; and further wherein said casing is made of thermosetting synthetic resin, the filter device assembly being enveloped by said casing upon thermosetting.

* * * * *